United States Patent [19]

Ohta et al.

[11] Patent Number: 4,778,747
[45] Date of Patent: Oct. 18, 1988

[54] METHOD OF MANUFACTURING OPTICAL MEMORY ELEMENT

[75] Inventors: Kenji Ohta, Yao; Akira Takahashi; Tetsuya Inui, both of Nara; Junji Hirokane, Tenri; Toshihisa Deguchi, Nara, all of Japan

[73] Assignee: Sharp Kabushiki Kaisha, Osaka, Japan

[21] Appl. No.: 17,456

[22] Filed: Feb. 24, 1987

Related U.S. Application Data

[63] Continuation of Ser. No. 712,205, Mar. 15, 1985, abandoned.

[30] Foreign Application Priority Data

Mar. 16, 1984 [JP] Japan .................................. 59-51977
Mar. 19, 1984 [JP] Japan .................................. 59-53843

[51] Int. Cl.$^4$ .......................... G03C 5/00; G11B 3/72
[52] U.S. Cl. ........................................ 430/321; 430/5; 430/323; 430/394; 430/397; 430/945; 369/279; 369/285
[58] Field of Search ................... 430/5, 321, 323, 945, 430/397, 394; 346/76 L; 369/284, 285, 286, 279

[56] References Cited

U.S. PATENT DOCUMENTS

| | | | |
|---|---|---|---|
| 4,423,137 | 12/1983 | Rester | 430/320 |
| 4,555,471 | 11/1985 | Barzynski et al. | 430/273 |
| 4,655,876 | 4/1987 | Kawai et al. | 156/643 |

FOREIGN PATENT DOCUMENTS

| | | | |
|---|---|---|---|
| 0214824 | 3/1987 | European Pat. Off. | 369/279 |
| 239954 | 11/1985 | Japan | 369/279 |

Primary Examiner—José G. Dees
Attorney, Agent, or Firm—Birch, Stewart, Kolasch & Birch

[57] ABSTRACT

A method of manufacturing an optical memory element, which includes the steps of applying a first photo-resist layer onto a glass substrate for an optical memory element, laying a mask plate on the glass substrate applied with the first photo-resist layer, with the mask plate being prepared by covering a surface of a transparent substrate with metallic layers formed into a guide pattern configuration, irradiating ultraviolet rays onto the first photo-resist layer through the mask plate, transferring the guide patterns of the mask plate onto the first photo-resist layer, and engraving the guide patterns in the glass substrate by etching after developing the first photo-resist layer.

10 Claims, 7 Drawing Sheets

METHOD OF MANUFACTURING OPTICAL MEMORY ELEMENT

This application is a continuation of application Ser. No. 712,205 filed on Mar. 15, 1985, now abandoned.

BACKGROUND OF THE INVENTION

The present invention generally relates to optical memory and more particularly, to a method of manufacturing an optical memory element for optically recording and reproducing information.

In recent years, particular attention has been directed to an optical memory device as a memory unit with a large capacity and also a high density. The reason why the optical memory device can provide the high density and large capacity that, since the bit, which is a recording unit of information, is determined only by a beam diameter of light, its configuration may be formed to have a size approximately in the order of one $\mu m$ in diameter. The above fact, however, imposes various limitations on an optical memory device. More specifically, in order to record information at a certain predetermined position or to reproduce information recorded at a certain predetermined position, it becomes necessary to position a light beam extreme accuracy.

Generally, in an optical memory device used exclusively for reproduction, address information can be preliminarily included in the recorded bit, thus making it possible to position the light beam during reproduction of the recorded information, but in an additionally recorded memory or in a memory capable of being rewritten, it is extremely difficult to record the address information simultaneously during the information recording. Accordingly, with respect to the additionally recorded memory or in the memory which can be rewritten, there has been adopted a practice to have certain guide tracks or guide addresses preliminarily included in a memory substrate.

Figure 9:
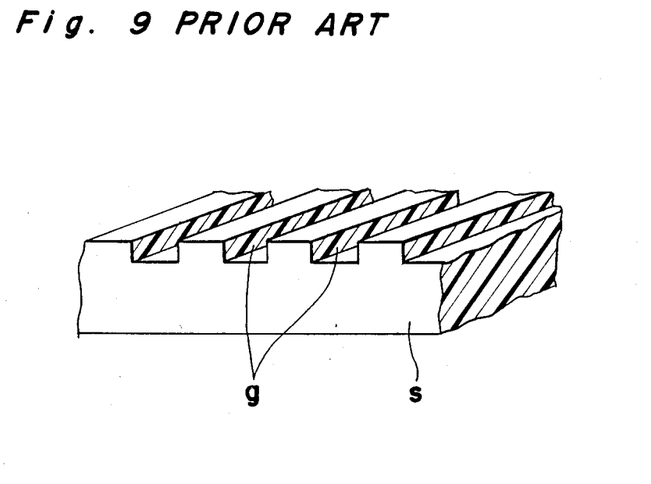
FIG. 9 is a fragmentary perspective view showing construction of a conventional memory substrate (previously referred to).

By way of example, as illustrated in FIG. 9 showing a fragmentary perspective view of a conventional memory substrate for an additionally recorded memory or a memory capable of being rewritten, it has been a common practice to form concave and convex grooves g in a substrate S for recording or reproducing information along said grooves g. These concave and convex grooves g have a configuration intermittently extending in a circumferential direction of the substrate S, thereby to impart bit information indicating addresses of the grooves g.

There have already been proposed several processes for forming such concave and convex grooves, which may be broadly divided into the following three kinds of practices.

(i) A process which employs acrylic resin or polycarbonate resin so as to form the concave and convex grooves as described above by injection molding. By this molding, configurations of an Ni stamper preliminarily formed with the guide tracks and guide addresses are copied or transcribed.

(ii) A casting process in which molten acrylic resin is poured into the Ni stamper preliminarily formed with the guide tracks and guide addresses as described above for curing or hardening through heating.

(iii) A so-called "2P" process in which an ultraviolet curing resin is poured between a substrate such as an acrylic resin substrate, glass substrate or the like and the Ni stamper preliminarily formed with the guide tracks and guide addresses as described above for irradiation thereonto of ultraviolet rays through said substrate, so as to cure or harden said resin, with a subsequent removal of said Ni stamper.

However, since each of the above processes employs a resin, there is a possibility that oxygen or moisture, etc. undesirably reaches a recording medium through the resin, thus resulting in such a disadvantage that the recording medium is deteriorated in quality.

In order to overcome the inconvenience as described above, the present inventors have already proposed in Japanese Patent Application Tokugansho No. 58-84613, a manufacturing process including steps of applying a photo-resist material onto a glass substrate, further applying a laser beam to the photo-resist material for recording guide patterns (guide tracks and guide addresses), and subsequently, forming grooves in the form of the guide patterns by etching.

The above process, however, still has a disadvantage in that, since each of the guide patterns must be successively recorded for each track by the laser beam, a long time is required for the recording and thus, the process is not fully suited to mass-production.

SUMMARY OF THE INVENTION

Accordingly, an essential object of the present invention is to provide an improved method of manufacturing an optical memory element, which is capable of effecting formation of grooves indicative of information related to guide tracks, guide addresses, etc. with respect to a substrate of the optical memory element, in a short period of time and at high accuracy through an improvement over the manufacturing method disclosed in said Japanese Patent Application Tokugansho 58-84613.

Another important object of the present invention is to provide a method of manufacturing an optical memory element as described above, which is simple in steps and readily introduced into a production line of the optical memory element.

In accomplishing these and other objects, according to one preferred embodiment of the present invention, there is provided a method for manufacturing an optical memory element which includes the steps of applying a first photo-resist film onto a glass substrate for an optical memory element, laying a mask plate on the glass substrate applied with the first photo-resist film, with the mask plate being prepared by covering a surface of a transparent substrate with metallic films formed into a guide pattern configuration, irradiating ultraviolet rays onto the first photo-resist film through the mask plate, transferring the guide patterns of the mask plate onto the first photo-resist film, and engraving the guide patterns in the glass substrate by etching after developing the first photo-resist film.

Moreover, according to a modification of the present invention, the method of manufacturing the optical memory element includes the steps of applying a first photo-resist film onto a glass substrate for an optical memory element, laying a mask plate on the glass substrate applied with the first photo-resist film with the mask plate being prepared by covering a surface of a resin layer having a sufficient flexibility larger than that of the glass substrate, with metallic films formed into a guide pattern configuration, irradiating ultraviolet rays onto the first photo-resist film through the mask plate, transferring the guide patterns of the mask plate onto the first photo-resist film, and engraving the guide patterns in the glass substrate by etching after developing the first photo-resist film.

By the procedures according to the present invention as described above, an improved method of manufacturing an optical memory element has been advantageously presented.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Before the description of the present invention proceeds, it is to be noted that like parts are designated by like reference numerals throughout the accompanying drawings.

Referring now to the drawings, a manufacturing method of an optical memory element according to the present invention will be described.

In FIGS. 1(a) through 1(e), there is shown a process for preparing a substrate for an optical memory element according to one preferred embodiment of the present invention in the order of steps (i) to (v) included therein and to be explained in detail hereinbelow.

Step (i)—A glass substrate for an optical memory element, which has a high reliability against passage of oxygen, moisture, etc. (i.e., which does not readily permit passage of oxygen, moisture, etc. therethrough) is washed, and a photo-resist layer or film 2 is applied onto the glass substrate 1 (FIG. 1(a)). The thickness of this photo-resist film 2 should preferably be in the order of about 100 to 500 nm.

Figure 1A:
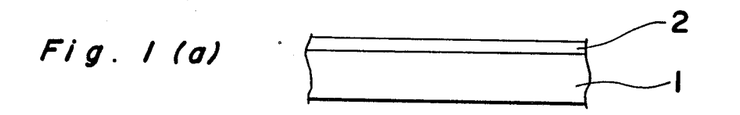
FIGS. 1(a) through 1(e) are fragmentary side sectional views for explaining a method of manufacturing a substrate of an optical memory element according to one preferred embodiment of the present invention.
Figure 1B:
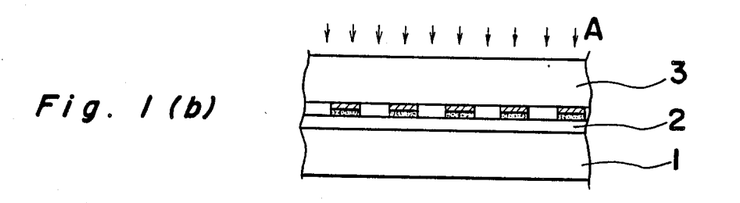

Step (ii)—A mask plate 3 having guide tracks and guide information formed into a pattern configuration is laid on the glass substrate 1 applied with said photo-resist film 2 in close contact therewith, and ultraviolet rays A are irradiated through the mask plate 3 so as to transfer mask patterns of said mask plate 3 onto said photo-resist film 2 (FIG. 1(b)). In the above case, since the optical memory element is in a circular shape, it is preferable that the above mask plate 3 is also in a circular configuration.

Figure 1C:
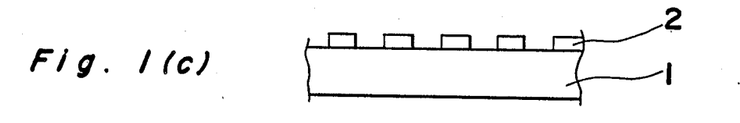

Step (iii)—By causing the photo-resist film 2 in which the mask patterns are written, to pass through a developing step, grooves are formed in the above photo-resist film 2 (FIG. 1(c)).

Figure 1D:
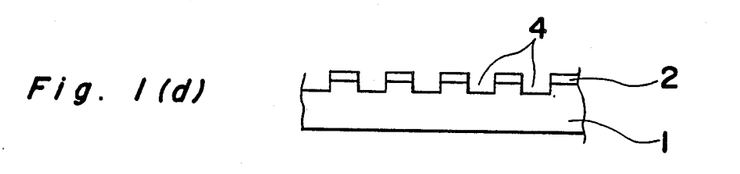
Figure 1E:
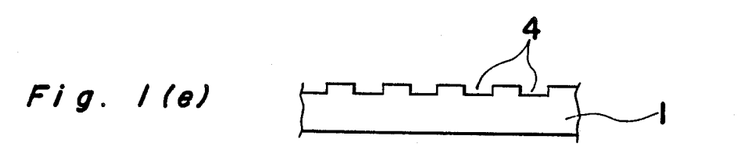

Step (iv)—In the state covered with the photo-resist film 2 formed with the grooves as described above, wet etching or dry etching such as sputtering (reactive ion etching) in etching gases such as $CF_4$, $CHF_3$, etc. is effected so as to form grooves 4 in the glass substrate 1 (FIG. 1(d)).

Step (v)—The photo-resist film 2 as described above is removed by a solvent such as acetone and the like or sputtering in $O_2$, etc. As a result, the grooves 4 are left in the glass substrate 1 (FIG. 1(e)).

By the foregoing steps, the glass substrate 1 having the grooves 4 representing the guide tracks and guide track information is completed. According to the above steps, since the mask plate 3 in which the guide tracks and guide information are formed into patterns is preliminarily prepared, and said mask plate 3 may be successively brought into close contact with the surface of the glass substrate 1 formed with the photo-resist film 2 for the transfer of the patterns on the mask plate 3, the recording time for the guide patterns can be reduced greatly.

Subsequently, the process for preparing the above mask plate 3 will be described in detail step by step with reference to FIGS. 2(a) through 2(f).

Figure 2A:
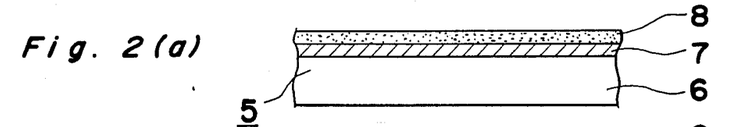
FIGS. 2(a) through 2(f) are fragmentary side sectional views for explaining steps of preparing a mask plate employed in the manufacturing method of FIGS. 1(a) to 1(e)
Figure 2B:
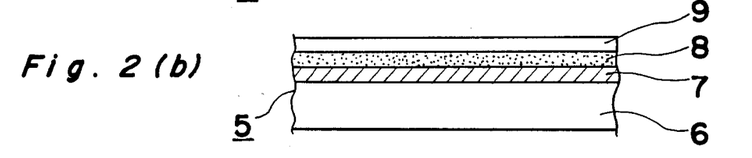

Step (i)—A disc-like low reflection Cr mask blank 5 is first prepared. As shown in FIG. 2(a), the mask blank 5 includes a silica glass substrate 6 having a favorable transmittance with respect to ultraviolet rays (depending on the kinds of ultraviolet rays, the substrate 6 may be of an ordinary soda lime glass polished at high accuracy), a Cr film 7 and a reflection preventing CrOx film 8 formed on the substrate 6. The mask blank 5 may be modified into a three-layered film construction including a Cr single layer film or CrOx film, a Cr film and another CrOx film.

Step (ii)—A photo-resist film 9 is coated onto the mask blank 5 as described above (FIG. 2(b)). For this photo-resist film 9, a positive type film, for example, AZ-1400 (name used in trade and manufactured by Shipley Co., Inc., U.S.A.), etc. may be employed. Although the thickness of the photo-resist film 9 may differ depending on the power of a laser beam adopted in the subsequent step (iii), it should properly be in the range of 100 to 500 nm in a normal practice.

Figure 2C:
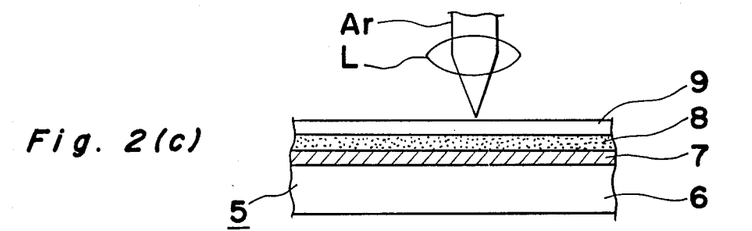
Figure 2D:
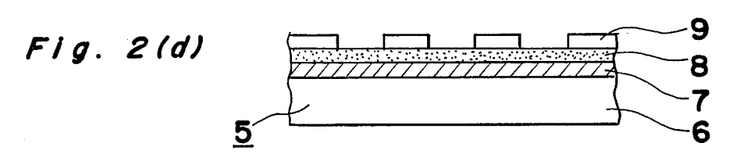

Step (iii)—On the mask blank 5 coated with the photo-resist film 9 as described above, guide tracks and guide addresses are recorded by collecting light of Ar laser through an objective lens L (FIG. 2(c)). In the case where Ar laser with a wavelength of 4579 Å is employed so as to be collected by the objective lens L to have a spot diameter of about 0.5 μm φ, a laser power of approximately 10 mW is obtained on the surface of said photo-resist film 9, and the track having a width of 0.6 μm can be recorded. In this case, light for the above pattern formation should properly be a laser having a wavelength shorter than 5000 Å in order to make the patterns of the guide tracks and guide addresses finer and also to improve sensitivity of the photo-resist film 9. Besides the Ar laser referred to above, krypton laser may be effectively utilized.

Step (iv)—By passing the mask blank 5 recorded with the guide tracks and guide addresses on the photo-resist film 9 in the above step (iii), through a developing step, grooves are formed on said photo-resist film 9 (FIG. 2 (d)). It is to be noted here that, in the diagrams from FIG. 2(d) through FIG. 2(f), magnification is increased in a lateral direction for clarification of the state of processing.

Figure 2E:
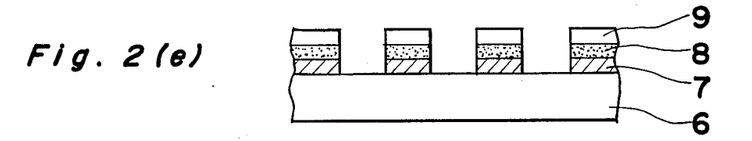
Figure 2F:
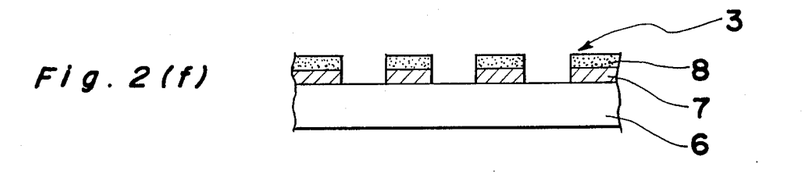

Step (v)—In the state covered by the photo-resist film 9 formed with the grooves as described above, etching is effected to remove the Cr film 7 and the CrOx film 8 at the predetermined portions on the glass substrate 6 (FIG. 2(e)).

Step (vi)—The remaining photo-resist film 9 is further removed by a solvent such as acetone and the like, or by sputtering in O₂, etc. (FIG. 2(f)). As a result, laminated layers of the Cr film 7 and the CrOx film 8 having the grooves representing information for the guide tracks and guide addresses may be formed on the glass substrate 6.

By the above steps, the disc-like mask plate 3 recorded with the spiral guide tracks, and the guide addresses by the intermittently continuous shape of the guide tracks, can be obtained.

Figure 3:
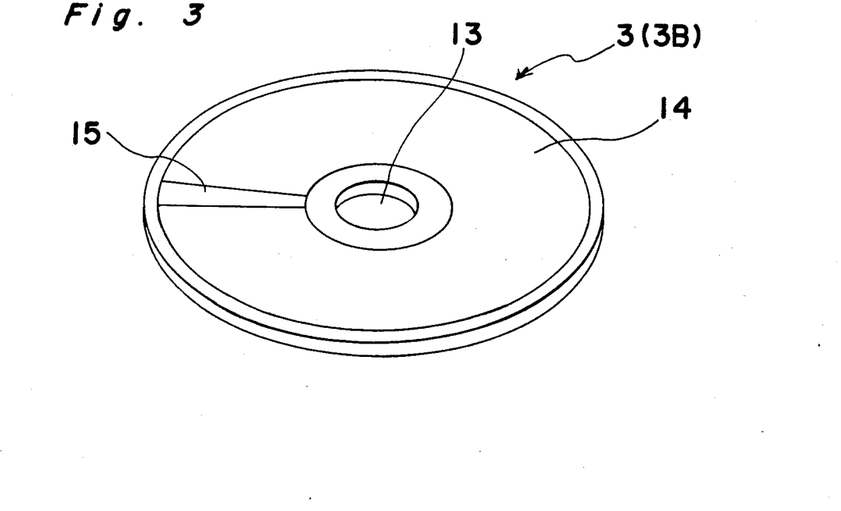
FIG. 3 is a perspective view showing a finished mask plate.

As shown in FIG. 3, the mask plate 3 thus prepared has an opening 13 formed at its central portion, the patterns of the guide tracks for the optical memory element formed at 14, and the patterns of the guide addresses for the optical memory element formed at 15. The central opening 13 is intended to facilitate the rotational driving during manufacture of the mask plate 3. More specifically, by holding the mask plate 3 with a screw device, magnet chuck or the like (not particularly shown) through utilization of the central opening 13 for fixing, the rotation of the mask plate 13 is stably effected for an efficient processing. However, in the case where a mechanism for holding the outer peripheral portion of the mask plate 3 or a mechanism for holding the mask plate 3 at its entire surface by vacuum attraction, etc. is employed, the central opening 13 of the mask plate 3 is not necessarily required.

Figures 4A, 4B:
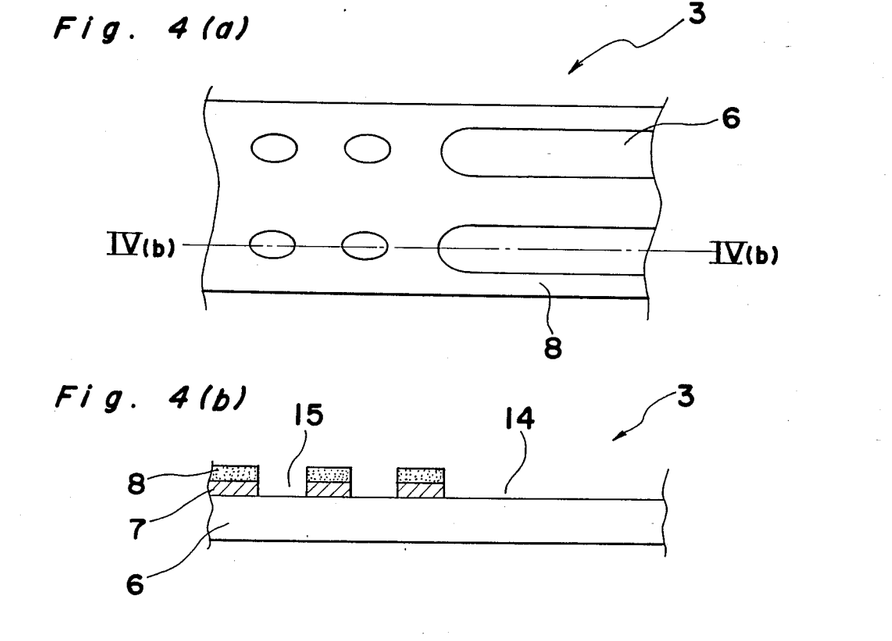
FIG. 4(a) is a fragmentary top plan view showing on an enlarged scale, part of the mask plate of FIG. 3.
FIG. 4(b) is a cross section taken along the line IV(b)—IV(b) in FIG. 4(a)

FIG. 4(a) is a fragmentary top plan view showing on an enlarged scale, part of the mask plate in FIG. 3, while FIG. 4(b) shows a cross section taken along the line IV(b)—IV(b) in FIG. 4(a).

Referring further to FIGS. 5(a) through 5(f), there is shown a modification of the process for preparing the mask plate 3B, the steps of which will be sequentially described hereinbelow.

Figure 5A:
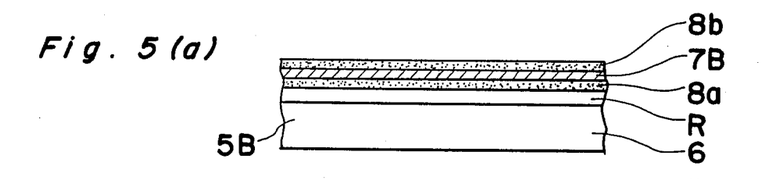
FIGS. 5(a) through 5(f) are fragmentary side sectional views similar to FIGS. 2(a) through 2(f) for explaining steps of preparing a mask plate, which particularly show a modification thereof.

Step (i)—In the similar manner as in the process of FIG. 2(a), a disc-like low reflection Cr mask blank 5B is first prepared. The modified mask blank 5B includes a silica glass substrate 6 having a favorable transmittance with respect to ultraviolet rays (depending on the kinds of ultraviolet rays, the substrate 6 may be of an ordinary soda lime glass polished at high accuracy), and an ultraviolet curing resin layer R having a sufficient flexibility larger than that of said glass substrate 6, a CrOx film 8a, a Cr film 7B, and another CrOx film 8b are successively formed on the substrate 6 as illustrated in FIG. 5(a).

Step (ii)—A photo-resist film 9 is coated onto the mask blank 5B as described above (FIG. 5(b)). For this photo-resist film 9, a positive type film, for example, AZ-1400 (name used in trade and manufactured by Shipley Co., Inc., U.S.A.), etc. may be employed. Although the thickness of the photo-resist film 9 may differ depending on the power of a laser beam adopted in the subsequent step (iii), it should properly be in the range of 100 to 500 nm in a normal practice.

Figures 5B, 5C:
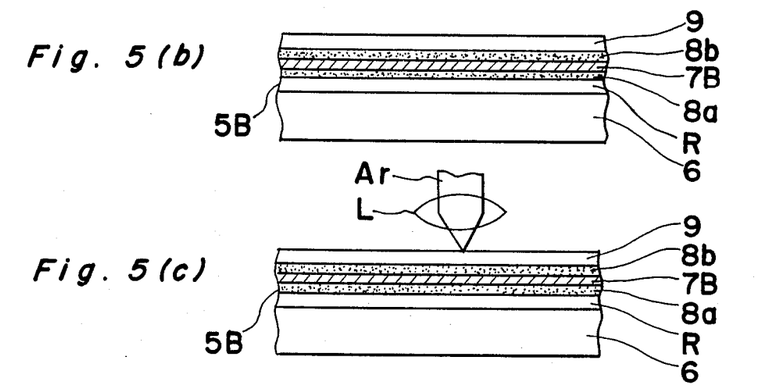

Step (iii)—On the mask blank 5 coated with the photo-resist film 9 as described above, guide tracks and guide addresses are recorded by collecting light of Ar laser through the objective lens L (FIG. 5(c)). In the case where Ar laser with a wavelength of 4579 Å is employed so as to be collected by the objective lens L with a N.A. at 0.75 to have a spot diameter of about 0.5 μm φ, a laser power of approximately 10 mW is obtained on the surface of said photo-resist film 9, and the track having a width of 0.6 μm can be recorded. In this case, light for the above pattern formation should properly be a laser having a wavelength shorter than 5000 Å in order to make the patterns of the guide tracks and guide addresses finer and also to improve sensitivity of the photo-resist film 9. Besides the Ar laser referred to above, krypton laser may be effectively utilized.

Step (iv)—By passing the mask blank 5B recorded with the guide tracks and guide addresses on the photo-resist film 9 in the above step (iii), through a developing step, grooves are formed on said photo-resist film 9 (FIG. 5 (d)). It is to be noted here that, in the diagrams from FIG. 5(d) through FIG. 5(f), magnification is increased in a lateral direction for clarification of the state of processing.

Figures 5D, 5E:
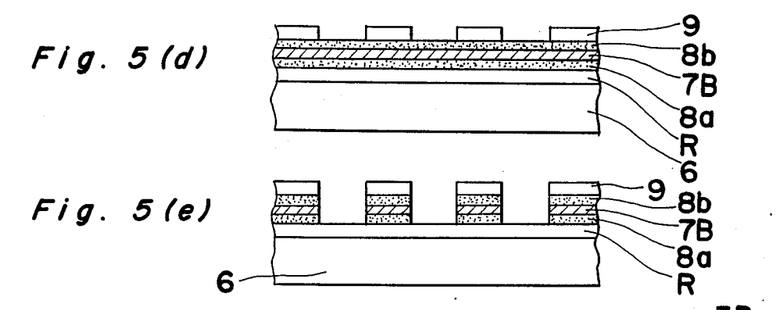
Figure 5F:
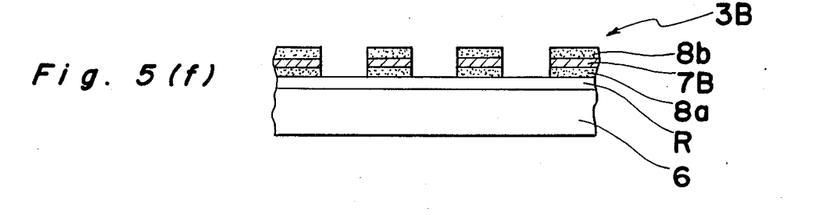

Step (v)—In the state covered by the photo-resist film 9 formed with the grooves as described above, etching is effected to remove the Cr film 7B and the CrOx films 8a and 8b at the predetermined portions on the glass substrate 6 (FIG. 5(e)).

Step (vi)—The remaining photo-resist film 9 is further removed by a solvent such as acetone and the like, or by sputtering in O₂, etc. (FIG. 5(f)). As a result, laminated layers of the Cr film 7B and the CrOx films 8a and 8b having the grooves representing information for the guide tracks and guide addresses may be formed on the glass substrate 6.

By the above steps, the disc-like mask plate 3B recorded with the spiral guide tracks at a pitch of 2 μm with a width of 1 μm, and the guide addresses by the intermittently continuous shape of the guide tracks, can be obtained. It is to be noted here that in the above mask plate 3B, the width at the track address portion should more preferably be narrowed for a better address signal quality after formation of the grooves on the substrate 6.

Figure 6A:
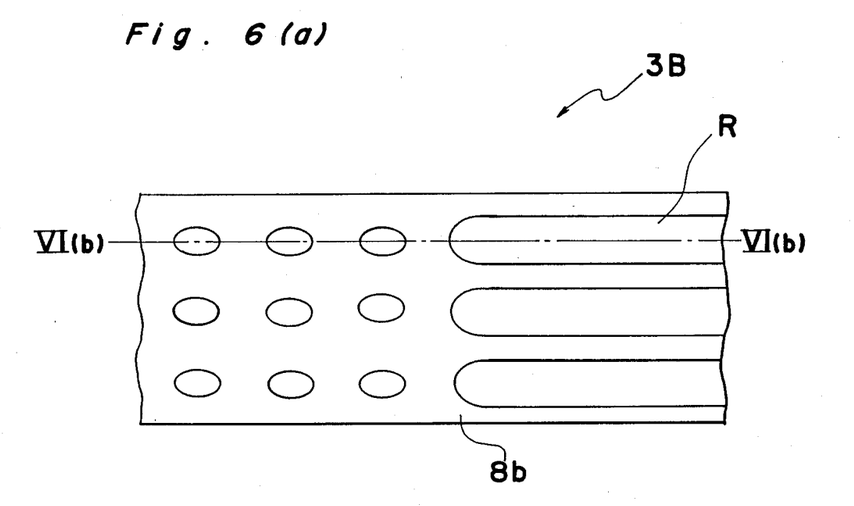
FIG. 6(a) is a fragmentary top plan view similar to FIG. 4(a) showing on an enlarged scale, part of a mask plate produced by the steps of FIGS. 5(a) through 5(f)
Figure 6B:
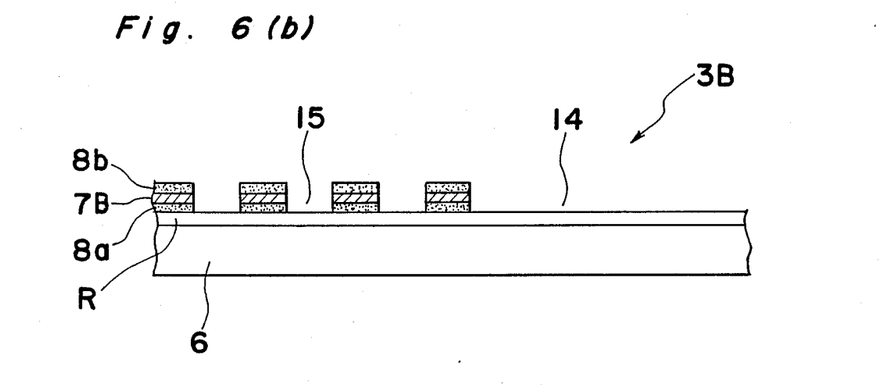
FIG. 6(b) is a cross section taken along the line VI(b)—VI(b) in FIG. 6(a)

Although not particularly shown, the mask plate 3B prepared by the above steps has the shape similar to the mask plate 3 shown in FIG. 3, and FIG. 6(a) shows a fragmentary top plan view of part of the mask plate 3B, while FIG. 6(b) shows a cross section taken along the line VI(b)—VI(b) in FIG. 6(a).

The mask plate 3B thus prepared also has the opening 13 at its central portion, the patterns of the guide tracks for the optical memory element formed at 14, and the patterns of the guide addresses for the optical memory element formed at 15 as described with reference to the mask plate in FIG. 3.

As is seen from the above description, the modified mask plate 3B has such construction that the resin layer R having a sufficient flexibility larger than that of the glass substrate 6 is formed on said substrate 6, while the reflecting metallic films of Cr film, etc. cut out into the guide pattern configuration to allow ultraviolet rays to pass therethrough are further laminated on said resin layer R, and therefore, in the case where pressure is applied between the mask plate and the glass substrate either mechanically or by evacuation therebetween, the mask plate and the substrate may be brought to be close to each other through flexibility of said resin layer R.

The above construction of the mask plate 3B may further be so modified that the glass substrate 6 is replaced by an acrylic resin substrate having a sufficient flexibility larger than the glass substrate 6, while reflecting metallic films in two layers of the Cr film and CrOx film or in three layers of the CrOx film, Cr film and CrOx film, cut out into the guide pattern configuration are laminated on said acrylic resin substrate. In this case, it is necessary that the acrylic resin substrate should be one capable of sufficiently transmitting ultraviolet rays.

Subsequently, there will be described the construction of an apparatus for effecting the step of recording the guide tracks and guide addresses on the photo-resist film 9 coated over the mask blank 5 through collection of Ar laser thereonto (FIG. 2(c)) with reference to FIG. 7.

Figure 7:
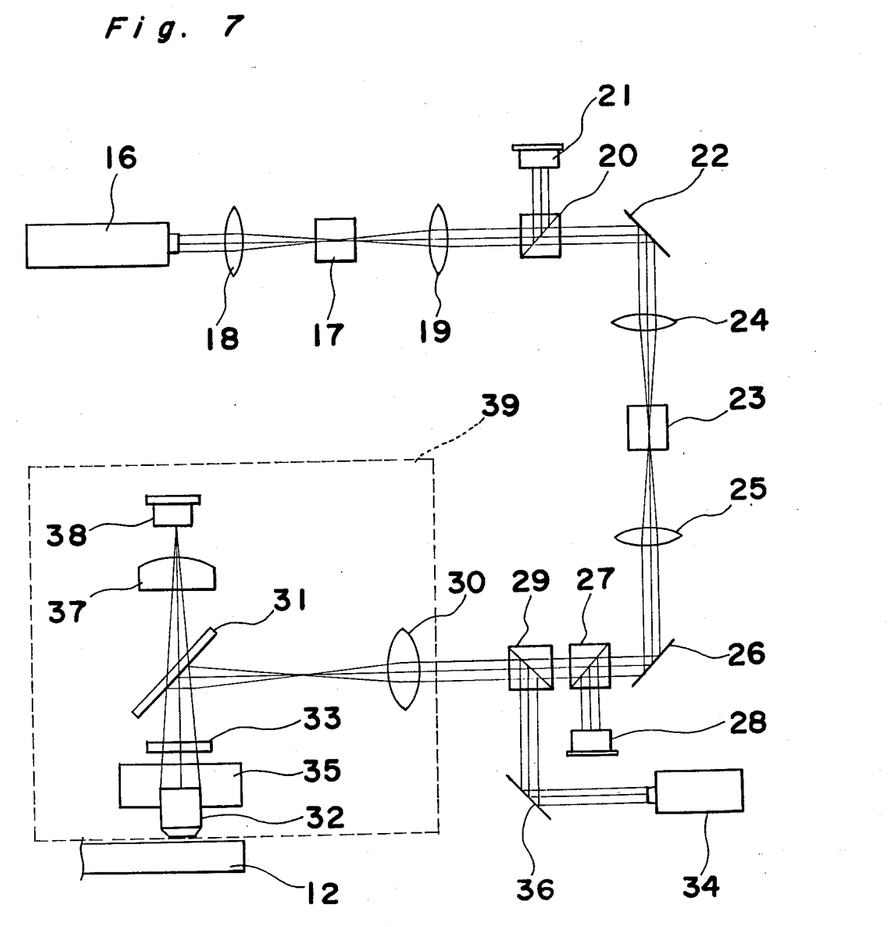
FIG. 7 is a diagram showing construction of an arrangement for effecting the step of recording guide tracks and guide addresses on a photo-resist film coated on a mask blank, by collecting Ar laser beams referred to in FIG. 2(c)

In the arrangement of FIG. 7, laser light with a wavelength of 4579 Å emitted from a light source 16 of Ar laser is projected into a beam splitter 20 through a light modulator 17 disposed between lenses 18 and 19 for improving the efficiency of the modulator 17, and part of the light is derived at the beam splitter 20 for power monitoring at a photo-detector 21, by the output of which said light modulator 17 is so controlled that the emitting power of the laser light becomes constant. The above function is effected to suppress the variation of the emitting power of the laser light due to fluctuation of circumstantial conditions such as room temperatures, etc.

The laser light is further led into a beam splitter 27 for modulated light monitoring, through a mirror 22 for changing the direction of the optical path for the laser light, a modulator 23 which modulates light for recording the guide addresses in the photo-resist film 9 and is disposed between lenses 24 and 25 for improving the efficiency of the modulator 23, and another mirror 26 for further changing the optical path direction of the laser light. At the beam splitter 27, part of the light is taken out for power monitoring at an optical detector 28. The laser light is collected by a spot lens 30 after passing through a dichroic mirror 29, and is led into an objective lens 32 through a polarization beam splitter 31. Between the beam splitter 31 and the object lens 32, there are provided a ¼ wavelength plate 33 arranged to meet the wavelength of a servo He-Ne laser 34 to be mentioned below, and an objective lens driving section 35 for applying the servo so as to collect the light onto the mask plate 3 at all times by vertically moving the objective lens 32. The light emitted from the He-Ne laser 34 to be used as the servo laser is changed in its optical path direction by a mirror 36, and is brought into the same optical path as the laser optical path by the AR laser light source 16 at a dichroic mirror 29. For this dichroic mirror 29, a mirror which allows Ar laser wavelength light (4579 Å) to pass, but subjects He-Ne laser wavelength light (6328 Å) to total reflection, is employed. Meanwhile, for the polarization beam splitter 31 referred to earlier, a beam splitter which reflects S wave of He-Ne laser light and transmits P wave thereof, but subjects Ar laser light to total reflection, is to be adopted. Above the polarization beam splitter 31, there is provided a cylindrical lens 37, and a quarter division detector 38 into which the light reflected by the mask plate 3 is incident, and the focusing-servo is applied by an output of this quarter division detector 38.

In FIG. 7, the portion 39, surrounded by dotted lines, is arranged to be movably supported by a moving device such as an air slider and the like (not shown), so that when the Ar laser is operated, with the moving device being shifted in a radial direction of the rotating mask plate 3, the spiral guide tracks and guide addresses may be recorded on the photo-resist film in the form of latent images.

In the formation of the grooves for the guide tracks and guide addresses with respect to the substrate of the optical memory element as described so far, the configuration of such grooves may be modified, for example, to concentric circles, while the information for the guide addresses is not limited to once per one cycle, but may be provided once per two or three cycles or further, several times per one cycle.

Figure 8:
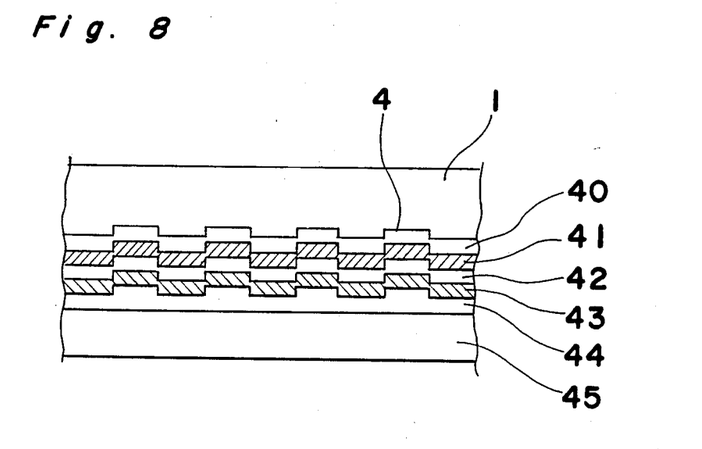
FIG. 8 is a fragmentary side sectional view of an optical memory element constituted through employment of the substrate obtained by the method of FIGS. 1(a) through 1(e)

Referring to FIG. 8, there is shown, on an enlarged scale, a fragmentary side sectional view of the optical memory element constituted by employing the substrate obtained by the steps described with reference to FIGS. 1(a) through 1(e).

In FIG. 8, the concave and convex grooves 4 (i.e., guide tracks) are formed on the glass substrate 1, while a dielectric film 40, for example, of an A±film, SiO film or the like having a refractive index larger than that of the glass substrate 1 is coated on said glass substrate 1. The dielectric film 40 referred to above has a film thickness in the order of about 500 to 1000 Å. Onto the dielectric film 40, an alloy thin film 41 (recording medium) composed of a rare earth group material such as GdTbFe, TbFe and GdCoFe, etc. and transition metal, is coated. The thickness of this alloy thin film 41 is in the order of approximately 50 to 400 Å, and the lower limit thereof is determined by preparing conditions of a vertically magnetized film, while the upper limit thereof is determined by increasing conditions of a magneto-optical effect, and accordingly, the proper film thickness of the above alloy thin film 41 depends on the method for the film formation. In the case where the alloy thin film 41 is formed by sputtering, if the film thickness is less than about 50 Å, it is difficult to obtain the vertically magnetized film, and therefore, said film thickness is required to be larger than approximately 50 Å. Over the alloy thin layer 41 as described above, another dielectric film 42 of AlN, $SiO_2$, etc. and a reflecting film 43 made of metals such as Cu, Al, stainless steel, Ni, etc., are formed. These dielectric film 42 and reflecting film 43 have functions to expedite improvement of characteristics for the magneto-optical effect, and also, to prevent oxygen and moisture from reaching the alloy thin film 41. On the reflecting film 43, there are further formed a bonding layer 44 and a protecting plate 45 made of glass, acrylic resin or the like, and bonded by said bonding layer 44. It may further be so modified, for example, that instead of employing the protecting plate 45, two sheets of memory elements are stuck back to back, to each other so as to provide a memory element for use at opposite surfaces.

In the foregoing embodiments, although the present invention has been mainly described with reference to the optical magnetic memory element of the reflecting film construction, the concept of the present invention is not limited in its application to such optical magnetic memory element alone, but may readily be applied to an optical magnetic memory element of a single layer film structure having a construction in which the thickness of the alloy thin film 41 in FIG. 8 is increased to omit the reflecting film 43, and also to an optical memory element of an additional recording type employing Te, TeS, TeOx, etc. as recording mediums.

As is clear from the foregoing description, according to the present invention, it is not required to employ resin materials in the formation of the guide signals or guide addresses for the optical memory element, and therefore, oxygen, moisture or the like is prevented from reaching the recording medium, thus providing optical memory elements at high reliability. Furthermore, according to the present invention, since the grooves for the guide patterns are efficiently and precisely formed on the substrate for the optical memory element, mass-productivity of optical memory elements can be markedly improved.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therern.

What is claimed is:

1. A method of manufacturing an optical memory element for recording and reproducing information, and having guide tracks and tracks for storing information, which comprises the steps of:
   (a) applying a first photo-resist film onto a glass substrate to form a coated substrate;
   (b) preparing a mask plate by covering a surface of a transparent substrate with a metallic film formed into a configuration corresponding to desired said guide tracks;
   (c) laying said mask plate on said coated substrate;
   (d) irradiating said coated substrate with ultraviolet rays passed through said mask plate to expose said first photo-resist film;
   (e) developing the exposed said first photo-resist film of said coated substrate to transfer said configuration of said mask plate onto said first photo-resist film; and
   (f) engraving said glass substrate by etching after removing said mask plate and developing said first photo-resist film to form guide tracks on said glass substrate so as to manufacture said optical memory element.

2. The method of manufacturing an optical memory element as claimed in claim 1, wherein said mask plate is a rotary member with a circular shape, and wherein said coated substrate is irradiated from a structure moving in a radial direction with respect to said mask plate.

3. The method of manufacturing an optical memory element as claimed in claim 3, wherein said mask plate is formed with an opening so as to be fixedly supported thereby with respect to a rotating drive member.

4. The method of manufacturing an optical memory element as claimed in claim 1 wherein said steps of preparing said mask plate comprises the steps of:
   providing a transparent substrate;
   applying a continuous metallic film over substantially the entire surface of said transparent substrate;
   coating said continuous metallic film with a second photo-resist film;
   irradiating said second photo-resist film with focused laser light in a desired pattern;
   developing said second photo-resist film to form patterns of remaining said second photo-resist film on said metallic film; and
   etching said metallic film into said configuration corresponding to desired said guide tracks.

5. A method of manufacturing an optical memory element for recording and reproducing information, and having guide tracks and tracks for storing information, which comprises the steps of:
   (a) applying a first photo-resist film onto a glass substrate for an optical memory element to form a coated substrate;
   (b) preparing a mask plate by,
      (i) covering a surface of a transparent substrate with a resilient resin layer, said resin layer having a flexibility substantially greater than that of said transparent substrate, and
      (ii) coating said resin layer with a metallic film formed into a configuration corresponding to desired guide tracks;
   (c) laying said mask plate on said glass substrate applied with said first photo-resist film, said metallic film conforming to the surface of said first photo-resist film due to the resilience of said resilient resin layer;
   (d) irradiating said coated substrate with ultraviolet rays passed through said mask plate to expose said first photo-resist film;
   (e) developing the exposed said first photo-resist film of said coated substrate to transfer said configuration of said mask plate onto said first photo-resist film; and
   (f) engraving said glass substrate by etching, after removing said glass plate and developing said first photo-resist film, to form guide tracks on said glass substrate so as to manufacture said optical memory element.

6. The method of manufacturing an optical memory element as claimed in claim 5 wherein the step of coating said resin layer comprises the steps of:
   applying a continuous metallic film over substantially the entire surface of said resilient resin layer;
   coating said continuous metallic film with a second photo-resist film;
   irradiating said second photo-resist film with focused laser light in a desired pattern;
   developing said second photo-resist film to form patterns of remaining said second photo-resist film on said metallic film; and
   etching said metallic film into said configuration corresponding to desired said guide tracks.

7. The method of manufacturing an optical memory element of claim 6 wherein said metallic film comprises a first and a second metallic film layer formed of chromium oxide and a third metallic film layer of Cr disposed between said first and second metallic film layers.

8. The method of manufacturing an optical memory element of claim 6 wherein a thickness of said second photo-resist layer is between 100 nm and 500 nm.

9. The method of manufacturing an optical memory element of claim 6 wherein said focused laser light is formed by an argon (Ar) laser.

10. The method of manufacturing an optical memory element of claim 6 wherein said focused laser light is formed by a krypton laser.

* * * * *